United States Patent
Carriere et al.

[11] Patent Number: 5,570,387
[45] Date of Patent: Oct. 29, 1996

[54] TWO-STAGE POWER LASER

[75] Inventors: Claude Carriere, Marcoussis; Bernard Groussin, Les Ulis; Christian Larat, Paris; Jean-Paul Pocholle, Arpajon/La Norville, all of France

[73] Assignee: Thomson-CSF Semiconducteurs Specifiques, Paris, France

[21] Appl. No.: 378,675

[22] Filed: Jan. 26, 1995

[30] Foreign Application Priority Data

Jan. 28, 1994 [FR] France ................... 94 00958

[51] Int. Cl.$^6$ ................................................ H01S 3/19
[52] U.S. Cl. ................ 372/50; 372/75; 372/92; 372/39; 372/6; 372/69
[58] Field of Search .................. 372/75, 92, 36, 372/69, 6, 50, 39

[56] References Cited

U.S. PATENT DOCUMENTS

| | | | |
|---|---|---|---|
| 4,768,199 | 8/1988 | Heinen et al. | 372/36 |
| 4,864,584 | 9/1989 | Martin | 372/75 |
| 5,084,886 | 1/1992 | Martin | 372/36 |
| 5,365,533 | 11/1994 | Groussin | 372/36 |

FOREIGN PATENT DOCUMENTS

| | | |
|---|---|---|
| 0369856 | 8/1989 | European Pat. Off. . |
| 0432009 | 11/1990 | European Pat. Off. . |
| 0548440 | 12/1991 | European Pat. Off. . |
| 4229499 | 9/1992 | Germany . |
| 54-069989 | 8/1979 | Japan . |
| 63-060578 | 8/1988 | Japan . |

*Primary Examiner*—Leon Scott, Jr.
*Attorney, Agent, or Firm*—Roland Plottel

[57] ABSTRACT

The disclosure is a high-power solid laser in which an emissive array of semiconductor lasers in a first stage pumps a solid YAG-type laser in a second stage. The structure of the emissive array, which is an integrated circuit, includes rods of semiconductor lasers alternating with grooves, the rods and grooves being parallel. The invention involves incrusting the material of the solid laser bars into the grooves between the rods of semiconductor lasers. This material is either placed in hybrid form or deposited to make an integrated structure.

25 Claims, 5 Drawing Sheets

5,570,387

TWO-STAGE POWER LASER

BACKGROUND OF THE INVENTION

The invention concerns a two-stage high-power semiconductor laser, including a medium-power laser, in the form of a two-dimensional array, which pumps a "lasing" material constituting a high-power laser. The structure according to the invention is different from known structures in that the two stages are not separate and facing each other, as in existing devices, but interpenetrate each other, either in hybrid or integrated form.

Solid semiconductor lasers, made from group III-IV materials such as GaAs, AlGaAs, GaInP, etc. are well known but, whether they are made of discrete parts or in the form of bars integrating several elementary lasers, they provide only small amounts of energy compared with gas or excimer lasers, for example, which are used for industrial applications requiring high power, such as cutting of ceramics, metals or cloth, or in medical applications.

The low power of elementary lasers—or even rods of lasers—has led to their combination into integrated circuit arrays including several rods of lasers on a substrate, the rods alternating with reflecting bars angled at 45°. The result is that these integrated laser circuits emit a light beam at 90° to the main surface of the substrate. Such an integrated laser circuit is described in the French patent n°2 639 150 filed on 15 Nov. 1988 by the applicant. The structure is summarized in FIG. 1 in which only the parts necessary to understand the structure are included and described. A substrate 1 of semiconducting materials carries several parallel rods such as 2 and 3 in which are formed a plurality of elementary lasers 4, using techniques known to professionals of the art. The longitudinal faces of the rods 2 and 3 perpendicular to the plane of the substrate 1 are located so as to form Fabry-Perrot cavities, such that the laser strips 4 emit, via the two cleaved faces, a light beam in a plane parallel to the main surface of the substrate. Reflecting bars are located between the rods 2 and 3 and parallel to them; their sides are rounded or inclined at 45° and reflect the light emitted by the lasers perpendicularly to the main surface of the substrate.

Emissive arrays applying this concept have been made: their dimensions are about 1 cm; by grouping several hundred or thousand elementary lasers of 100 μm size an optical power of 1 kW can be achieved.

To increase the peak power even more and improve the spectral purity, one known technique is to associate a solid laser and at least one emissive integrated laser array of the type described above, which supplies the optical pumping energy for the solid laser.

A solid laser, as opposed to a semiconductor laser (which is also solid), is one in which bars of square or round section, about 5 cm by 5 mm, or arrays of material such as the YAG (yttrium-aluminum-garnet), YLF (yttrium-lithium-fluorine) or $LiNbO_3$ (lithium niobate), doped with neodymium for example. These bars emit coherent light in the windows centered on 1.06, 1.55 or 2.1 μm, respectively, when they are excited. There are many publications on this subject, since optical pumping by semiconductor lasers gives a significantly better yield than pumping by a flash lamp (limited to about 1%).

FIG. 2 shows the association of a solid YAG laser, for example, and an optical pumping device making use of semiconductor lasers. The main faces of a YAG array 6 are sandwiched between at least two emissive laser arrays 7 and 8 whose emitted beams are oriented towards the array 6 which produces a secondary emission. This type of association is known, for example, in the patent by the applicant previously mentioned and the patent U.S. Pat. No. 5,115,445, dated 19 May 1992. FIG. 2 should be interpreted widely, since there are known examples of solid lasers 6 pumped by a plurality of elementary semiconductor lasers or in rods whose light energy is directed towards the solid laser 6 by means of a system of mirrors or optical fibers.

Whatever the geometrical form of the association shown in FIG. 2 between:

one or more semiconductor lasers,
  illuminating, either directly or by reflection via flat or conical reflectors or optical fibers or lenses or any other combination of these,
one or more solid lasers in the form of cylindrical bars or arrays, all the associations have one common characteristic: the optical pumping lasers are geometrically or spatially separated and do not form an integrated structure. These associations of primary and secondary lasers may form a single device by using mechanical means of attachment, yet the materials of the semiconductor lasers and the solid laser (YAG) do not interpenetrate in a single layer.

SUMMARY OF THE INVENTION

According to the invention, a high-power laser is formed by associating an emissive array of integrated semiconductor lasers, having a single common substrate, and a "lasing" material pumpable by the semiconductor lasers. The originality of this high-power laser is that the lasing material constituting the second laser is incrusted between the rods of semiconductor lasers of the integrated emissive array and that the high-power laser is monolithic. The lasing material is positioned between the rods of semiconductor lasers instead of and at the position of the reflecting bars 5 of the array used in the prior art (FIG. 1). Thus the main axis of each bar of lasing material is located in the plane of the emitting strips of the semiconductor lasers, which pump the active material transversely simultaneously via two of its faces. The term monolithic must be taken in the broad sense since the laser according to the invention can be fabricated in hybrid form, by placing bars of lasing material in the grooves between the rods of semiconductor lasers, or in integrated form by growing or depositing lasing material in these same grooves. That this laser is monolithic does not imply that it is monocrystalline.

More precisely the invention concerns a high-power two-stage laser including:

a first stage comprising an emissive array on a common substrate, including a plurality of primary semiconductor lasers integrated into at least two mutually parallel rods separated by at least one groove, these primary lasers emitting light in a plane parallel to the main plane of the emissive array and in a direction perpendicular to the lateral longitudinal faces of the rods, said light providing the optical pumping energy for:

a second stage constituted by at least one solid laser of a material pumpable by the light energy emitted by said primary lasers which excite this secondary laser;
wherein the solid material of said secondary laser is incrusted in said groove between said rods of primary lasers which illuminate directly said solid laser via two lateral longitudinal faces.

BRIEF DESCRIPTION OF THE DRAWINGS

The invention will be better understood from the following more detailed description of a few embodiments, making reference to the appended figures, of which.

MORE DETAILED DESCRIPTION

In order to simplify and clarify the description, we shall refer to the primary laser part of the invention as "semiconductor lasers" or the "emissive array". This comprises a series of rods of elementary lasers of GaAs, AlGaAs or other group III-V material, all these lasers being integrated into a single semiconducting substrate. We shall call the secondary laser of the invention a "YAG laser", a generic term which designates all active (lasing) material, which is not limited to YAG but includes YLF and $LiNbO_3$, among others, and also doped glass optical fibers.

Similarly, the figures show only a small, elementary part of the laser according to the invention. To obtain the high power required, an emissive array including several tens of rods each containing several tens of laser strips is required; a precise graphic representation of the entire structure is therefore impossible.

Figure 1:
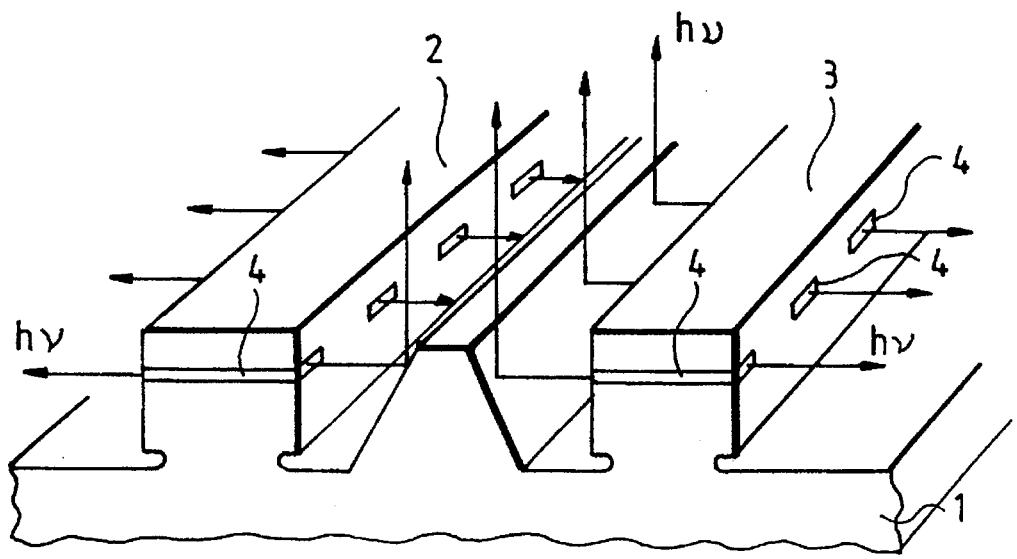
FIG. 1 is a drawing showing the principle of a prior art emissive array of semiconductor lasers, described above.
Figure 2:
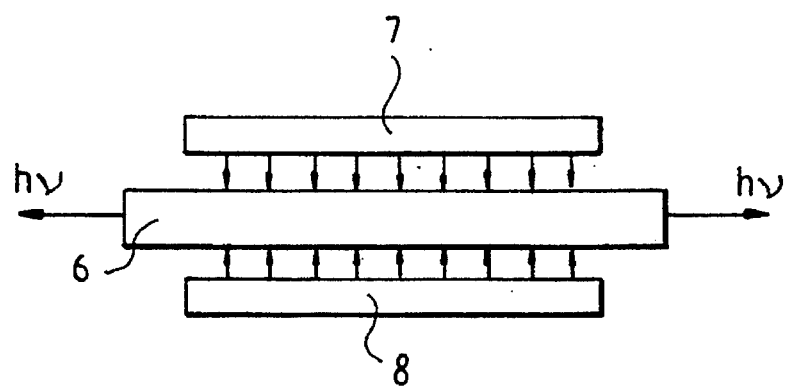
FIG. 2 is a drawing of a prior art assembly associating a primary semiconductor laser and a secondary solid laser, also described above.
Figure 3:
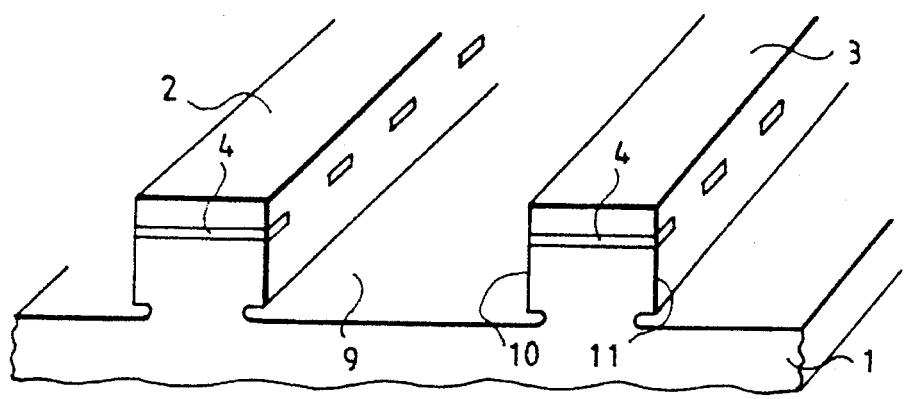
FIGS. 3 is a view of a fragment of the semiconductor lasers array of the laser according to the invention.

FIG. 3 shows the "semiconductor lasers" part of a first embodiment of the invention. This is the basic component to which we shall add later the "YAG laser" part. It includes the semiconductor substrate 1 which carries a set of mutually parallel rods 2–3 of laser diodes 4. The reflecting bars located between each pair of rods in the prior art (FIG. 1), are replaced here by grooves 9 of about 50–250 μm width; the width and height of the grooves are substantially the same as those of the rods 2–3 of lasers 4.

This array of semiconductor lasers is fabricated using the process described in the French patent 2 639 150 mentioned earlier, except as regards the reflecting bars 5 (since there are none). However we recall here that a series of layers, suitably doped if necessary, constituting the smoothing layer, the confinement layer, the cavities layer, etc. are epitaxially grown on a substrate 1, of GaAs for example, using known methods. These layers, covering the whole of the face of the substrate 1 are etched to form grooves 9, then the faces 10 and 11 of the rods 2–3 are cleaved by ultrasound, using a known technique, so as to form the reflectors of the Fabry-Perrot cavities. The semiconductor lasers 4 are preferably guided by the gain, although at this stage the polarization metallizations have not yet been deposited. The semiconductor lasers are designed for emission in the near infrared, for pumping of rare earth materials, such as neodymium $Nd^{3+}$, ytterbium $Yb^{3+}$ and erbium $Er^{3+}$ or emission in the visible spectrum for pumping of chrome $Cr^{3+}$ for example.

Figure 4:
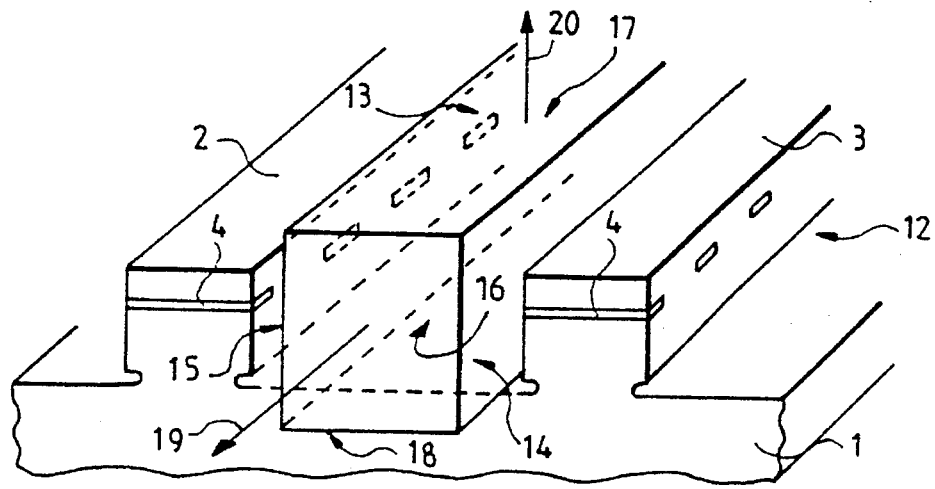
FIG. 4 is a view of a fragment of a first embodiment of a high-power laser according to the invention.

The array of semiconductor lasers in FIG. 3 constitutes the primary laser of a high-power laser obtained by adding a secondary laser such as that shown in FIG. 4. In a first embodiment, a YAG bar 13 is inserted in the groove 9 separating two rods 2–3 of an emissive array globally referenced as 12. The lasing YAG material is thus pumped transversely by two longitudinally opposing faces 14 and 15 which are in close or intimate contact with the cleaved faces 10–11 of the semiconductor lasers 4.

The high-power emission from this solid secondary laser 13 can be extracted in two ways. First by longitudinal extraction, represented by the arrow 19, in which the end face 16 (and the opposite face) is polished or cleaved, depending on the material, and treated to extract the energy parallel to the rods 2–3, via one or both of the end faces 16. A second possibility is to metallize the end faces 16 and the lower longitudinal face 18 resting on the bottom of the groove 9 to make them reflecting. The energy of the secondary laser is then extracted via the single face 17, by transversal or surface extraction, represented by the arrow 20, in a direction perpendicular to the substrate 1 of the array 12 and to the laser rods 2–3.

The structure shown in FIG. 4 is of hybrid type in that a plurality of YAG bars 13, after machining, are placed in a plurality of grooves 9 of an integrated circuit 12.

In practice, it is advantageous to conserve for the solid laser 13 a gain zone of approximately rotational symmetry. For the "longitudinal" extraction for example, the groove should be typically about 200 μm wide, or about twice as wide as deep. To obtain good yields it is necessary to use a material of high absorption coefficient so that the pumping power absorbed over this distance is as great as possible. For example, the absorption coefficient of the $YVO_4$:Nd near 810 nm is about 40 $cm^{-1}$, which corresponds to 50% of the pumping power absorbed over 200 μm. This value can be improved:

- either by using a material even more absorbing;
- or by adapting the geometry of the laser cavity so that the beam is more wide than high, to increase the width of the active medium and the groove;
- or by increasing the depth of the groove, and therefore its width, by using a thicker substrate or, in the event of thermal problems, by etching of the support of the laser diodes itself.

Figure 5:
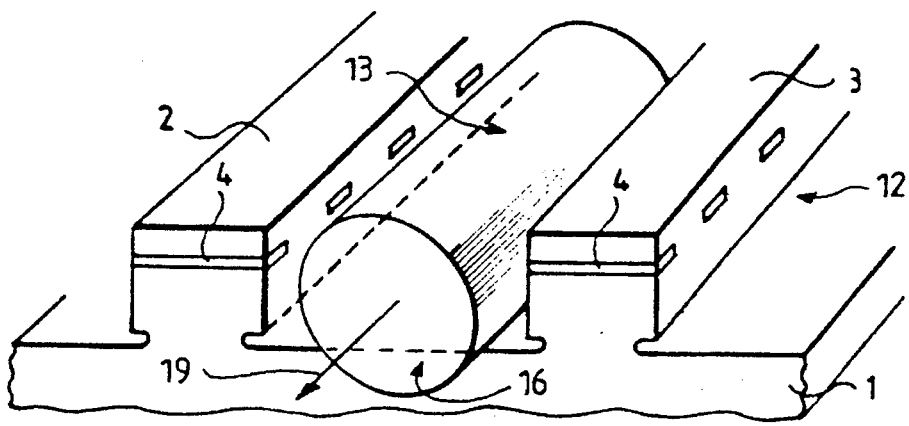
FIG. 5 shows a high-power laser like that of FIG. 4 in which the secondary laser has a different geometry.

The lasing material 13 is shown in FIG. 4 in the form of a YAG bar of polygonal section, i.e. square or rectangular. However, this shape is not obligatory: FIG. 5 shows a variant of the invention in which the lasing material of the secondary laser is in the form of a cylinder of circular section. In this case the emission of the secondary laser can only be, of course, longitudinal via the end faces which are made reflecting. The cylindrical shape is advantageous: materials such as YAG or more easily procured in the form of threads of 200–25 μm diameter than in the form of square bars whose end faces must be polished.

In addition, the cylinder 13 of FIG. 5 can be a section of optical fiber of glass or silica doped so that the material is pumpable by the primary semiconductor laser. The two end faces of each optical fiber are adapted to create a Fabry-Perrot cavity; we shall see later that this is not obligatory since the cavity can be extended to a greater distance.

However, rather than fixing the bars of lasing material 13 on the integrated circuit 12 to make a hybrid device, it is possible to make a totally integrated laser of high power.

Figure 6:
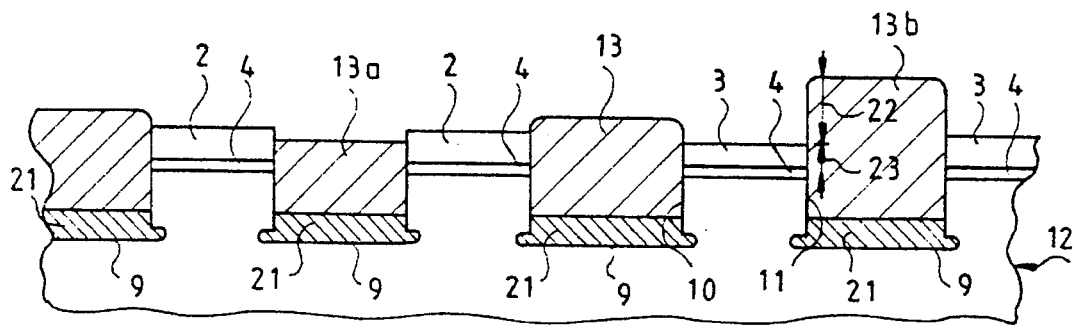
FIG. 6 is a view of fragment of a second embodiment of a high-power laser according to the invention.

FIG. 6 shows a sectional view of such a laser in a second embodiment of the invention.

Only the strict minimum of the emissive array 12 of semiconductor lasers, shown in section, is shown in this figure: three rods 2–3 of lasers 4, separated by grooves 9 and supported by a single integrating substrate. The faces 10 and 11 of the rods 2–3 have been cleaved to create resonant laser cavities 4.

Using the emissive array 12 as a base substrate, by using masking techniques known to professionals it is possible, by epitaxy or deposition, to place the pumpable material 13 in the grooves 9 between the rods 2–3 of semiconductor lasers 4. The primary lasers 12 and the secondary lasers 13 are therefore integrated on the same emissive chip.

Of course it is necessary to deposit first one or two smoothing layers 21 in the bottoms of the grooves, since these are indispensable for the matching of the crystalline lattice parameters since, in the example chosen, GaAs has a cubic crystalline form with centered faces whereas YAG is rhombohedral. The nature of the smoothing layer(s) depends on those of the materials to be matched.

The material of the YAG laser 13 can be obtained by deposition or by growing over different thicknesses. In FIG. 6, the items 13 and 13a show two possibilities in which the material substantially fills the groove 9 up to the height of the rods 2–3. This is most common case, and the thickness of the YAG must be such that the material of the secondary laser 13 reaches the level of the lasers 4 of the primary laser array.

Item 13b shows a third possibility in which the YAG is much thicker than the adjacent 2–3. This epitaxic over-thickness 22 is easily obtained by masking and lift-off. We shall see later the usefulness of this third possibility in which the over-thickness 22 should be at least equal to the distance 23 between the top of the rod 3 and the laser strip 4.

In a second integrated embodiment, the material 13 used to fill the grooves 9 does not have cleaved faces. It is not possible by cleaving to transform the upper face 17 into a reflector, so there can be no surface extraction of the laser energy. The light emission is longitudinal, via the ends (16 in FIG. 4). Cleaving these end faces after having deposited a thick layer of material, such as YAG, would be difficult (since the part to be cleaved is projecting). It would be preferable to polish these end faces 16 using IBAE (Ion Beam-Assisted Etching), a known method which has been described, for example, by J. P. Donnelly et al. in Applied Physics Letters, 51 (15), 12 Oct. 1987, p 1138.

Figure 7:
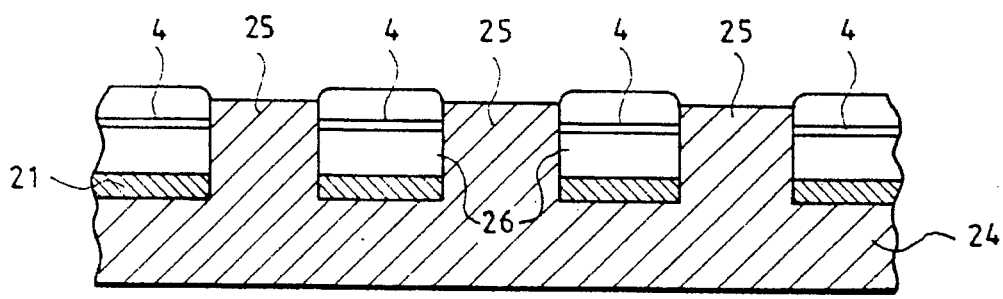
FIG. 7 is a sectional view of a third embodiment according to the invention, which is a "complement" of the structure shown in FIG. 6.

The "complement" of the integrated structure in FIG. 6 is shown in FIG. 7. By "complement" we mean that instead of growing the YAG material in the grooves 9 of the array 12 of group III-V semiconductor material, in the structure shown in FIG. 7 the layers of group III-V material are grown in grooves cut in an array of YAG.

An array 24 of YAG or other pumpable material which will constitute the solid secondary laser is made sufficiently thick so that it is possible to etch, by selective chemical etching for example, along the crystalline planes at least two rods 25 whose vertical longitudinal faces 26 are mutually parallel. These faces 26 are machined by ionic etching to obtain a reflecting surface. In each groove between two rods 25 group III-V material is grown using epitaxy or CVD to form a series of semiconductor lasers 4; there are one or more smoothing layers 21 to match the crystalline lattice parameters between the YAG and the GaAs, and at least one active layer between two confinement layers to form a laser 4 whose optical cavity is in intimate contact with the reflecting faces 26 of the YAG "comb".

In this structure the secondary emission by the YAG laser can be extracted longitudinally via the ends of the rods 25, or extracted by the surface via the upper face of the rods 25 (on the opposite side from the "substrate", whose lower face should be treated to create a Fabry-Perrot cavity.

A power laser according to FIG. 7 is a second type of integrated laser.

So far we have considered a solid laser 13 emitting longitudinally because its two end faces are cleaved or polished and made reflecting to form a Fabry-Perrot cavity whose length is equal to the length of the bar or cylinder 13. However, this is not the only possibility.

Figure 8:
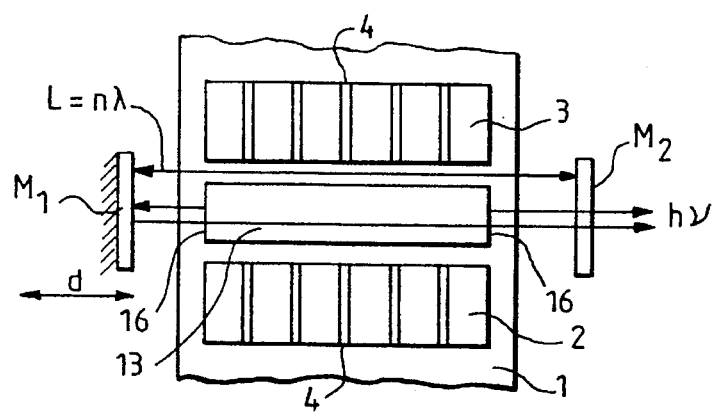
FIG. 8 is a plan view of a high-power laser with a tunable cavity, according to the invention.

FIG. 8 shows a plan view of another power laser with a tunable cavity whose frequency (or wavelength) is adjustable. This figure shows a basic configuration including a substrate 1, two rods 2–3 of primary lasers 4 and a bar or cylinder of lasing material 13, as in FIGS. 4 to 7.

The end faces 16 of the bar 13 are polished, but in this case they are not mirrored to form a Fabry-Perrot cavity between them. According to this variant of the invention, the end faces of the Fabry-Perrot cavity are constituted by two mirrors M1 and M2 located outside the power laser structure and on the optical axis of the bar 13. One of the mirrors, for example M1, is mirrored whereas the other is not and provides an outlet for the light beam hv. The two mirrors M1 and M2 are located at a distance L that is a multiple of the wavelength $\lambda$ and that can be adjusted by moving at least one of the mirrors by a distance d. In this case, the material 13 constitutes an amplifier of the light emitted by the primary lasers, and the true secondary laser is the cavity formed between the two mirrors M1 and M2.

In order to keep them simple, FIGS. 4 to 8 show only a fragment of the power laser, limited to a single level in space: a set of semiconductor lasers of a given integrated circuit 12 (FIGS. 4 and 5) is associated with a set of solid lasers 13. However, the associations could be different, with alternative spatial structures.

Figure 9:
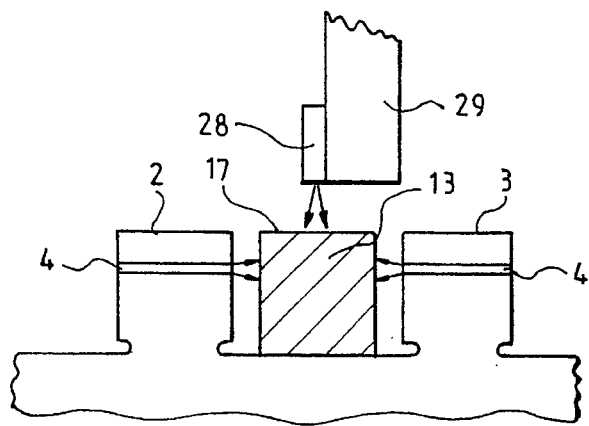
FIG. 9 is a sectional view of a laser structure with optical pumping via three faces, according to the invention.

A first example is shown in FIG. 9 in which, in order to increase the pumping energy of a solid laser bar 13, included in an emissive semiconductor array 12, the bar 13 is illuminated on its upper longitudinal face 17 by a rod of lasers 28 attached to a support 29. This rod of lasers 28 is of known type, in the form of a stack of laser diodes, fabricated by cutting into strips—rather than into chips—a slice of semiconductor material in which the lasers have been integrated.

In this type of structure the light beam of the YAG laser is extracted via one of the two end faces 16, depending on how the faces have been formed, but the optical pumping of a single bar of YAG is made via three longitudinal faces, by means of three systems of primary lasers: two rods 2–3 and a rod 28.

Figures 10, 11:
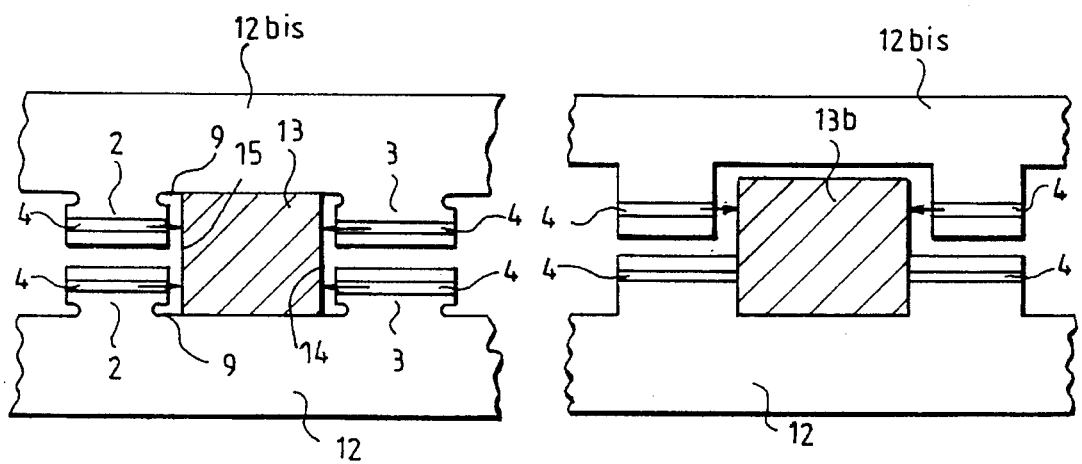
FIGS. 10 and 11 are sectional views of two examples of associations of integrated circuits of semiconductor lasers and solid lasers composed of separate elements, according to the invention.

The optical pumping power can be further increased by pumping on two longitudinal faces only, but by means of four systems of primary lasers. FIG. 10 shows a hybrid form of this: a suitably prepared bar 13 of YAG is sandwiched between two emissive arrays 12 and 12bis carefully prepared so that their grooves 9 are facing each other and form a tunnel in which the YAG bar fits. Thus the lateral longitudinal faces 14 and 15 of the YAG bar are pumped by the lasers 4 of four rods forming the tunnel.

FIG. 11 shows the same type of structure but in an integrated form. One of the emissive arrays, 12 for example, includes a YAG bar 13b whose thickness is greater than the height of the rods of semiconductor laser 2–3, as shown in the right hand part of FIG. 6. A second emissive array 12bis is laid on the first array sandwiching the YAG bar 13b between the two arrays, as in FIG. 8. However, in order to adjust the second array on the first, it is preferable that the grooves 9 of the mobile array 12bis are wider than those on the array 12 on which the YAG 13b has been grown.

In both FIGS. 10 and 11, the power laser beam is obtained by longitudinal extraction via the end faces of the YAG bars.

In fact, since this high-power laser is obtained by associating a large number of primary semiconductor lasers 4 and solid YAG secondary lasers 13, these elements can be integrated into a monolithic structure, in the same way that the array 12 is a monolithic structure.

Figure 12:
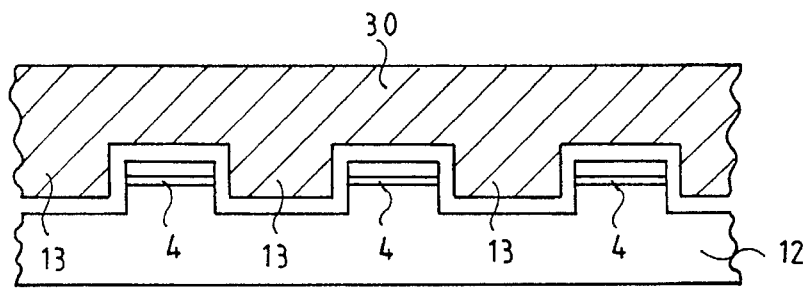
FIGS. 12 and 13 are sectional views of a two examples of associations of integrated circuits of semiconductor lasers and solid monolithic lasers, according to the invention.

FIG. 12 shows a first form: the numerous YAG bars 13 that are placed in the grooves between the rods of lasers 4 in an emissive array 12 all form part of a single YAG array 30 which is machined, by chemical means for example, into the shape of a one-sided comb. With this comb it is possible to emit a light beam by surface extraction, via the free surface of the YAG comb 30. It is also possible to utilize this same surface to make a thermal contact in the form of a radiator, in which case the laser beam is extracted longitudinally.

Figure 13:
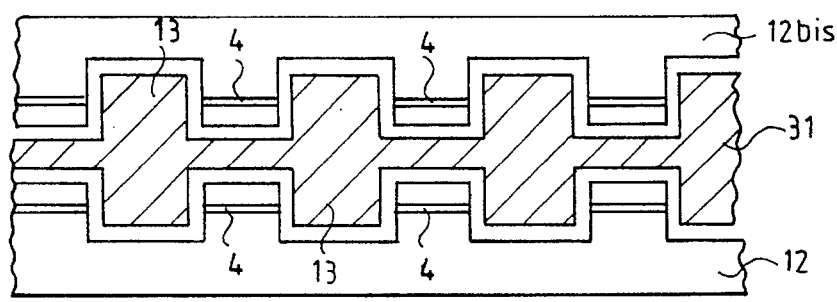

FIG. 12 corresponds to the structure shown in FIG. 4 in which a plurality of YAG bars 13 is assembled in a monolithic array. Similarly, FIG. 13 corresponds to the structure shown in FIG. 10: a sufficiently thick array of YAG is cut into the form of a double-sided comb 31 with a series of bars on each side and which is sandwiched between the emissive arrays 12 and 12bis. In this case the YAG bars 13 forming the teeth on one side of the comb are preferentially aligned with those on the opposite side.

Figure 14:
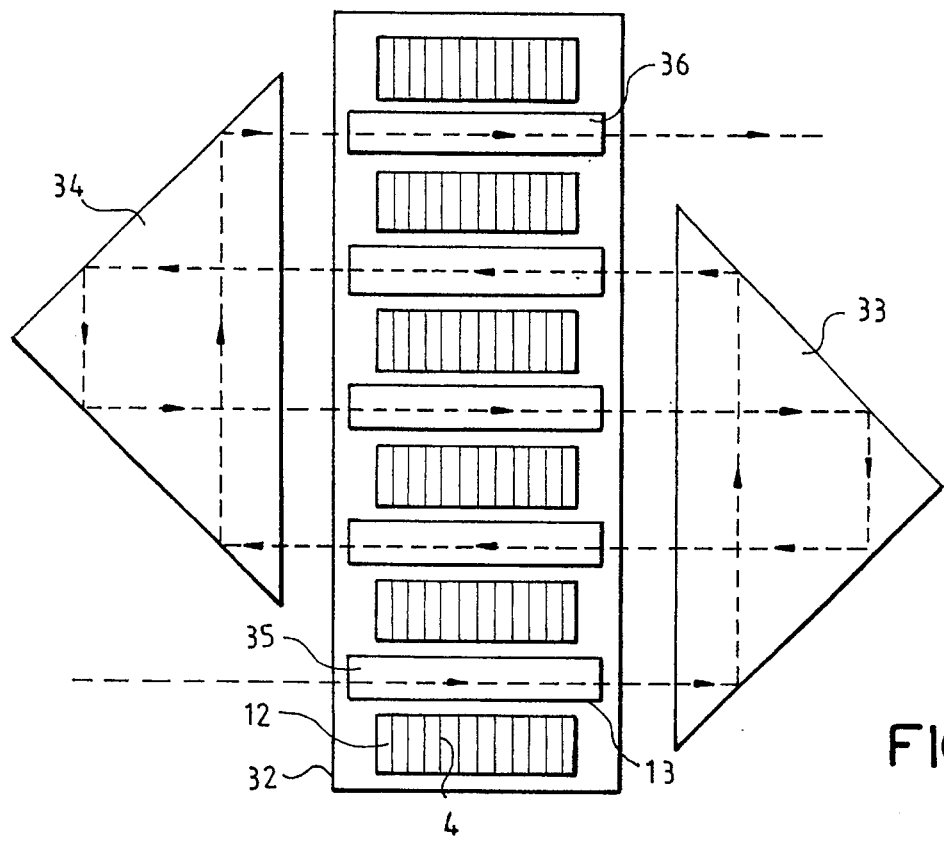
FIG. 14 is a plan view of a high-power optical summing assembly, according to the invention.

Finally, FIG. 14 shows a plan view of an optical assembly which adds the optical powers emitted by all the powerful secondary lasers according to the invention. A plurality of rods of semiconductor lasers and a plurality of solid laser bars 13 is united on a common support 32. This could be for example a GaAs substrate or a YAG array, depending on whether the structure corresponds to one of those shown in FIGS. 4 to 13, but with longitudinal emission. Two back-reflecting prisms 33 and 34 are positioned in the plane defined by the laser beams from the YAG bars 13, one prism on each side of the support 32 and with its largest face parallel to the edge of the support 32, in other words perpendicular to the light beams emitted by the YAG lasers 13. The hatched line in the figure shows the optical path of the laser beam: according to known optical laws the beams from each YAG laser are reflected by the faces of the prims 33 and 34 in the directions of the arrows, their powers being cumulated to produce a final emission of high power.

Two cases are possible. In the first case, the end faces 35 and 36 of the two YAG bars at the ends of the structure are not reflecting and each YAG laser emits via both the cleaved faces (only one of the two beams is shown in FIG. 14). The power of each beam is the sum of the powers emitted by each of the YAG bars 13.

In the second case, one of the end faces of one of the two YAG bars at the ends of the structure (face 35 for example) is metallized to make it reflecting. The light which normally exits by this face is then reflected back by this face, producing a laser beam exiting via the symmetrically located face 36. The power of this beam is twice that of the first case.

In the same way that FIGS. 8 to 10 are applicable when the secondary laser is in the form of a doped optical fiber, the configuration in FIG. 14 is also quite valid, without any modification, if the cylinders 13 are sections of doped optical fibers.

To conclude, the invention concerns a high-power laser including two stages: a first stage comprising a plurality of primary semiconductor lasers providing the energy necessary for optical pumping of a second stage constituted by solid secondary lasers, the two stages being associated by physically interlocking the two types of laser, the material of the solid lasers being in direct contact with the material of the semiconductor lasers and also being located in the plane defined by the beams emitted by the semiconductor lasers which are integrated in an emissive array.

It will be clear to professionals of the art that the materials mentioned as examples do not limit the scope of the invention, which is defined by the claims below.

What is claimed is:

1. A high-power two-stage laser comprising a first laser stage and a second laser stage, said first laser stage having an emissive array integrated into a monolithic substrate, said substrate having a main face, said first stage including a plurality of primary semiconductor lasers integrated into said monolithic substrate, said primary semiconductor lasers having at least two mutually parallel rods separated by at least one groove formed in said monolithic substrate, said primary semiconductor lasers emitting light in a plane parallel to said main face and in a direction perpendicular to said parallel rods, said light providing optical pumping energy for said second laser stage, said second laser stage having at least one solid laser of an optically pumpable material, said solid material of said second stage laser comprising a material incrusted in said groove between said rods of said first laser stage, said solid material being illuminated by the first laser stage.

2. A high power laser according to claim 1, wherein said monolithic substrate is made of a group III-V semiconductor material.

3. A high power laser according to claim 2, wherein said monolithic substrate is selected from the group consisting of GaAs or GaAlAs.

4. A high power laser according to claim 2 or 3, wherein said optically pumpable material is selected from the group consisting of YAG (yttrium-aluminum-garnet), YLF (yttrium-lithium-fluorine), LiNbO$_3$ (lithium niobate) doped with neodymium.

5. A high power laser according to claim 2 or 3, wherein said optically pumpable material is a doped optical fiber.

6. A high power laser according to claim 1, wherein said second laser stage optical pumpable material includes at least one bar of pumpable material bonded to said substrate within said groove.

7. A high power laser according to claim 6, wherein said bar has a polygonal cross-section.

8. A high power laser according to claim 6, wherein said bar has a cylindrical shape with circular cross-section.

9. A high power laser according to claim 1, wherein said optically pumpable material is deposited in said groove.

10. A high power laser according to claim 1, wherein said solid lasers of the second stage comprise end faces perpendicular to said parallel rods, and to said main face of the substrate, and wherein laser light is emitted by said solid lasers through said end faces.

11. A high power laser according to claim 10, wherein said solid laser of the second stage comprises two mirrors located near said end faces for forming resonant cavity, the emitted light wavelength being adjustable by changing the position of said mirrors.

12. A high power laser according to claim 10, wherein said end faces are reflecting.

13. A high power laser according to claim 1 wherein said solid lasers of the second stage emits light perpendicularly to said main face of the substrate.

14. A high power laser according to claim 1, comprising at least one additional pumping laser placed above said main face and above said optically pumpable material.

15. A high power laser according to claim 1 comprising another monolithic substrate including another group of primary semiconductor lasers and a groove, said monolithic substrates facing each other, and said optically pumpable material being in the form of a bar extending on one side within the groove of one of said substrates and on another side within the groove of said another substrate so as to be pumped by the primary lasers of both substrates.

16. A high power laser according to claim 1 wherein said second stage laser comprises a plate having an array of parallel bars and grooves between said parallel bars, and wherein said plate faces said monolithic substrate with said bars within said at least one groove of said monolithic substrate.

17. A high power two stage laser including a first laser stage and a second laser stage, said high power laser comprising a monolithic substrate, made of an optically pumpable laser material, said substrate having a main face and comprising at least one longitudinal groove formed in said main face, said first laser stage comprises an emissive array facing into said at least one groove, said emissive array formed of a plurality of primary semiconductor lasers integrated into said groove of said monolithic substrate, said primary semiconductor lasers emitting light in a plane parallel to said main face and towards said optically pumpable material adjacent said at least one groove, said emitting light providing optical pumping energy for said second laser stage, and wherein said second laser stage comprises said optically pumpable material adjacent said groove.

18. A high power laser according to claim 17, wherein said semiconductor lasers are made in a group III-V semiconductor material.

19. A high power laser according to claim 18, wherein said optically pumpable material is selected from the group consisting of YAG (yttrium-aluminum-garnet), YLF (yttrium-lithium-fluorine, $LiNbO_3$ (lithium niobate) doped with neodymium.

20. A high power laser according to claim 17, wherein said solid lasers of the second stage comprise end faces perpendicular to said longitudinal groove and to said main face of the substrate and wherein laser light is emitted by said solid lasers through said end faces.

21. A high power laser according to claim 20, wherein said solid laser of the second stage comprises two mirrors located near said end faces for forming resonant cavity, and the emitted light wavelength being adjustable by changing the position of said mirrors.

22. A high power laser according to claim 20, wherein said end faces are reflecting.

23. A high power laser according to claim 17, wherein said solid lasers of the second stage emit light perpendicularly to said main face of the substrate.

24. A high power laser according to claim 17, comprising at least one additional pumping laser placed above said main face and above said optically pumpable material.

25. A high power laser according to claim 17, wherein said semiconductor lasers are formed in a semiconductor material epitaxially grown in said at least one groove.

* * * * *